US006531875B2

United States Patent
Satake

(10) Patent No.: US 6,531,875 B2
(45) Date of Patent: Mar. 11, 2003

(54) VEHICLE BATTERY'S OPEN CIRCUIT VOLTAGE ESTIMATING METHOD AND A SYSTEM THEREFOR

(75) Inventor: Shuji Satake, Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 10/002,114

(22) Filed: Dec. 5, 2001

(65) Prior Publication Data
US 2002/0113594 A1 Aug. 22, 2002

(30) Foreign Application Priority Data

Dec. 8, 2000 (JP) .................................... 2000-375133
Apr. 5, 2001 (JP) .................................... 2001-107137

(51) Int. Cl.$^7$ ............................................. G01N 27/46
(52) U.S. Cl. ...................................................... 324/429
(58) Field of Search ............................. 324/427, 429, 324/134, 162

(56) References Cited

U.S. PATENT DOCUMENTS 4,607,227 A * 8/1986 Heitert et al. ............... 324/437
6,366,054 B1 * 4/2002 Hoenig et al. .............. 320/132

FOREIGN PATENT DOCUMENTS

| DE | 0 508 030 | 4/1991 |
|----|-----------|--------|
| EP | 1 167 987 | 1/2002 |
| JP | 7-98367   | 4/1995 |

OTHER PUBLICATIONS

Copy of Great Britain patent application Communication with Great Britain Serach Report for corresponding Great Britain patent application No. 0129280.4 dated Jul. 26, 2002.

* cited by examiner

Primary Examiner—Gregory J. Toatley, Jr.
(74) Attorney, Agent, or Firm—Armstrong, Westerman & Hattori, LLP

(57) ABSTRACT

A vehicle battery's open circuit voltage estimating method and a system therefor for relatively correctly estimating an open circuit voltage of a battery on a vehicle within a relatively short period after completion of the charge or the discharge also without a temperature correction is provided. A disconnected voltage measuring means 23a-1 measures a disconnected voltage of the battery multiple times in a definite period of time after a predetermined period of time after completion of charge or discharge of the battery. An approximate expression determining means 23a-2 determines a power approximate expression having a negative power number by using a difference value of the measured disconnected voltage and an assumed open circuit voltage. And, an arithmetic operation controlling means 23a-3 makes the approximate expression determining means update the assumed open circuit voltage and determine the power approximate expression repeatedly until the power number of the determined power approximate expression becomes −0.5 or about −0.5, and the assumed open circuit voltage is estimated to be the open circuit voltage when the power number becomes −0.5 or about −0.5.

8 Claims, 6 Drawing Sheets

VEHICLE BATTERY'S OPEN CIRCUIT VOLTAGE ESTIMATING METHOD AND A SYSTEM THEREFOR

BACKGROUND OF THE INVENTION

1. Field of the Invention

The present invention relates to a vehicle battery's open circuit voltage estimating method and a system therefor for estimating an open circuit voltage of a vehicle-borne battery which supplies electric power to vehicle-borne loads.

2. Description of the Related Art

An open circuit voltage of a battery is obtained by measuring a terminal voltage (i.e. disconnected voltage) in a disconnected state of the battery in an equilibrium state. The open circuit voltage of a battery indicates a charged state of the battery and is the most important for grasping how much of the electricity is charged (i.e. the charged state) in the battery aboard the vehicle.

Generally, when the discharged electricity flows from the battery, the terminal voltage of the battery drops according to the current. Reversely, when the charging current flows, the terminal voltage rises. For example, the voltage drop at the discharge is due to an impedance (i.e. combined resistance) of the battery and consists of a voltage drop (IR loss) due to a pure resistance (ohmic resistance) based on the structure of the battery, a voltage drop due to the activation polarization of the polarization resistance component based on the chemical reaction, and a voltage drop due to the concentration polarization of the polarization resistance component based on the chemical reaction.

The IR loss becomes 0 at the same time of the discharge current becoming 0. The voltage drop due to the activation polarization becomes 0 relatively in a short time. Though the voltage drop due to the concentration polarization lowers according to decrease of the discharge current, this voltage drop remains relatively long time after the discharge current has become 0 since the dissolution of the concentration polarization by diffusion of the electrolyte needs relatively long time. The above state of the voltage drop due to the discharge remaining after the discharge is called a non-equilibrium state. The terminal voltage (the disconnected voltage) of the battery measured in a disconnected state in the above state is to be different from a disconnected voltage (an open circuit voltage) in the equilibrium state wherein the voltage drop due to the discharge has dissolved (i.e. disappeared) and, that is, changes toward the open circuit voltage as time goes on after the discharge stopped.

Here, the disconnected voltage of the battery which rose by the flow of the charging current is different from the open circuit voltage since the risen voltage due to the concentration polarization remains relatively long time similarly to the case of the discharge.

Generally, the terminal voltage of the battery changes toward the open circuit voltage as shown in FIG. 3 after the completion of the charge and as shown in FIG. 9 after the completion of the discharge. The time to reach the equilibrium state, in a case of the charge completion for example, is shorter when the temperature is higher as shown in FIG. 10.

Therefore, the disconnected voltage measured at 24 hours after the completion of the discharge, when the equilibrium state can be expected, is generally considered to be the open circuit voltage.

With respect to the above method, however, the disconnected voltage to be the open circuit voltage is measured after waiting until the equilibrium state. If the discharge or the charge is carried out before passing such a time, there is no chance to measure the disconnected voltage until a definite time has passed.

And, since the time until the equilibrium state is affected by the temperature, if the disconnected voltage is measured and considered to be the open circuit voltage after a fixed time has passed without considering the ambient temperature, the measured disconnected voltage should vary. This causes an error and requires a correction due to temperature.

SUMMARY OF THE INVENTION

An object of the present invention is to provide a vehicle battery's open circuit voltage estimating method and a system therefor which can relatively correctly estimate an open circuit voltage of a battery on a vehicle within a relatively short period after the completion of the charge or discharge also without a correction due to temperature.

The present inventions with the following first to fourth aspects relate to the vehicle battery's open circuit voltage estimating method, and the inventions with the following fifth to eight aspects relate to the vehicle battery's open circuit voltage estimating system. Each invention has a basis that the disconnected voltage of the battery after the charge or discharge changes asymptotically along a predetermined power approximate expression toward a predetermined voltage which can be estimated as an open circuit voltage.

In order to achieve the above object, as a first aspect of the present invention, a vehicle battery's open circuit voltage estimating method for estimating an open circuit voltage of a vehicle-borne battery supplying electric power to vehicle-borne loads comprises the steps of: measuring a disconnected voltage of the battery multiple times in a definite period of time after a predetermined period of time after completion of charge or discharge of the battery; determining a power approximate expression having a negative power number by using a difference value of the measured disconnected voltage and an assumed open circuit voltage; repeating the determination of the power approximate expression by updating the assumed open circuit voltage until the power number of the determined power approximate expression becomes −0.5 or about −0.5; and estimating the assumed open circuit voltage to be the open circuit voltage when the power number becomes −0.5 or about −0.5.

According to the first aspect of the present invention, in a vehicle battery's open circuit voltage estimating method for estimating an open circuit voltage of a vehicle-borne battery supplying electric power to vehicle-borne loads, a disconnected voltage of the battery is measured multiple times in a definite period of time after a predetermined period of time after completion of charge or discharge of the battery. A power approximate expression having a negative power number is determined by using a difference value of the measured disconnected voltage and an assumed open circuit voltage. The determination of the power approximate expression is repeated by updating the assumed open circuit voltage until the power number of the determined power approximate expression becomes −0.5 or about −0.5, and the assumed open circuit voltage is estimated to be the open circuit voltage when the power number becomes −0.5 or about −0.5. Therefore, an asymptote of the power approximate expression not changing due to the temperature can be estimated to be the open circuit voltage by measuring the disconnected voltage of the battery in a relatively short time after completion of the charge or the discharge of the battery. Therefore, a vehicle battery's open circuit voltage estimating method, which can relatively correctly estimate the open circuit voltage of the battery in a relatively short time after completion of the charge or the discharge of the battery without a temperature correction, can be provided.

As a second aspect of the present invention, based on the first aspect, the power approximate expression is given by a $\alpha \cdot t^D$ with time t, an unknown coefficient $\alpha$, and an unknown negative power number D, when the disconnected voltage is measured after completion of the charge.

According to the second aspect of the present invention, the power approximate expression is given by $\alpha \cdot t^D$ with time t, an unknown coefficient $\alpha$, and an unknown negative power number D, when the disconnected voltage is measured after completion of the charge. And, the assumed open circuit voltage is estimated to be the open circuit voltage when the power number becomes −0.5 or about −0.5. Therefore, an asymptote of the power approximate expression not changing due to the temperature can be estimated to be the open circuit voltage by measuring the disconnected voltage of the battery in a relatively short time after completion of the charge of the battery. Therefore, a vehicle battery's open circuit voltage estimating method, which can estimate the open circuit voltage of the battery in a relatively short time after completion of the charge of the battery without a temperature correction, can be provided.

As a third aspect of the present invention, based on the first aspect, the difference value for determining the power approximate expression is an absolute value obtained by subtracting the assumed open circuit voltage from the measured disconnected voltage when the disconnected voltage is measured after completion of the discharge, and the power approximate expression is given by $\alpha \cdot t^D$ with time t, an unknown coefficient $\alpha$, and an unknown negative power number D.

According to the third aspect, the difference value for determining the power approximate expression is an absolute value obtained by subtracting the assumed open circuit voltage from the measured disconnected voltage when the disconnected voltage is measured after completion of the discharge, and the power approximate expression is given by $\alpha \cdot t^D$ with time t, an unknown coefficient $\alpha$, and an unknown negative power number D. And, the assumed open circuit voltage is estimated to be the open circuit voltage when the power number becomes −0.5 or about −0.5. Therefore, an asymptote of the power approximate expression not changing due to the temperature can be estimated to be the open circuit voltage by measuring the disconnected voltage of the battery in a relatively short time after completion of the discharge of the battery. Therefore, a vehicle battery's open circuit voltage estimating method, which can estimate the open circuit voltage of the battery in a relatively short time after completion of the discharge of the battery without a temperature correction, can be provided.

As a fourth aspect of the present invention, based on the second or third aspect, the power number D of the power approximate expression is determined by a regression computation processing by using a plurality of measured disconnected voltages and corresponding times from the completion of the charge or the discharge.

According to the forth aspect, the power number D of the power approximate expression is determined by a regression computation processing by using a plurality of measured disconnected voltages and corresponding times from the completion of the charge or the discharge. Accordingly, even if the power number D of the power approximate expression $\alpha \cdot t^D$ does not become −0.5, the assumed open circuit voltage can be estimated to be the open circuit voltage when the determination of the power approximate expression is repeated by a predetermined number of times. Therefore, an asymptote of the power approximate expression not changing due to the temperature can be accurately estimated to be the open circuit voltage by measuring the disconnected voltages of the battery in a relatively short time after completion of the charge or the discharge of the battery. Therefore, a vehicle battery's open circuit voltage estimating method, which can relatively correctly estimate the open circuit voltage of the battery in a relatively short time after completion of the charge or the discharge of the battery without a temperature correction, can be provided.

As a fifth aspect of the present invention, a vehicle battery's open circuit voltage estimating system for estimating an open circuit voltage of a vehicle-borne battery z supplying electric power to vehicle-borne loads comprises: a disconnected voltage measuring means for measuring a disconnected voltage of the battery multiple times in a definite period of time after a predetermined period of time after completion of charge or discharge of the battery; an approximate expression determining means for determining a power approximate expression having a negative power number by using a difference value of the measured disconnected voltage and an assumed open circuit voltage; and an arithmetic operation controlling means for making the approximate expression determining means update the assumed open circuit voltage and determine the power approximate expression repeatedly until the power number of the determined power approximate expression becomes −0.5 or about −0.5, wherein the assumed open circuit voltage is estimated to be the open circuit voltage when the power number becomes −0.5 or about −0.5.

According to the fifth aspect, a disconnected voltage measuring means measures a disconnected voltage of the battery multiple times in a definite period of time after a predetermined period of time after completion of charge or discharge of the battery. An approximate expression determining means determines a power approximate expression having a negative power number by using a difference value of the measured disconnected voltage and an assumed open circuit voltage. And, an arithmetic operation controlling means makes the approximate expression determining means update the assumed open circuit voltage and determine the power approximate expression repeatedly until the power number of the determined power approximate expression becomes −0.5 or about −0.5, and the assumed open circuit voltage is estimated to be the open circuit voltage when the power number becomes −0.5 or about −0.5. Therefore, a vehicle battery's open circuit voltage estimating system, which can relatively correctly estimate the open circuit voltage of the battery in a relatively short time after completion of the charge or the discharge of the battery without a temperature correction, can be provided.

As a sixth aspect of the present invention, based on the fifth aspect, the power approximate expression is given by $\alpha \cdot t^D$ with time t, an unknown coefficient $\alpha$, and an unknown negative power number D, when the disconnected voltage is measured after completion of the charge.

According to the sixth aspect of the present invention, the power approximate expression is given by $\alpha \cdot t^D$ with time t, an unknown coefficient $\alpha$, and an unknown negative power number D, when the disconnected voltage is measured after completion of the charge. And, the assumed open circuit voltage is estimated to be the open circuit voltage when the power number becomes −0.5 or about −0.5. Therefore, an asymptote of the power approximate expression not changing due to the temperature can be estimated to be the open circuit voltage by measuring the disconnected voltage of the battery in a relatively short time after completion of the charge of the battery. Therefore, a vehicle battery's open circuit voltage estimating system, which can estimate the open circuit voltage of the battery in a relatively short time after completion of the charge of the battery without a temperature correction, can be provided.

As a seventh aspect of the present invention, based on the fifth aspect, the difference value for determining the power approximate expression is an absolute value obtained by subtracting the assumed open circuit voltage from the measured disconnected voltage when the disconnected voltage is measured after completion of the discharge, and the power approximate expression is given by $\alpha \cdot t^D$ with time t, an unknown coefficient $\alpha$, and an unknown negative power number D.

According to the seventh aspect, the difference value for determining the power approximate expression is an absolute value obtained by subtracting the assumed open circuit voltage from the measured disconnected voltage when the disconnected voltage is measured after completion of the discharge, and the power approximate expression is given by $\alpha \cdot t^D$ with time t, an unknown coefficient $\alpha$, and an unknown negative power number D. And, the assumed open circuit voltage is estimated to be the open circuit voltage when the power number becomes −0.5 or about −0.5. Therefore, an asymptote of the power approximate expression not changing due to the temperature can be estimated to be the open circuit voltage by measuring the disconnected voltage of the battery in a relatively short time after completion of the discharge of the battery. Therefore, a vehicle battery's open circuit voltage estimating system, which can estimate the open circuit voltage of the battery in a relatively short time after completion of the discharge of the battery without a temperature correction, can be provided.

As an eighth aspect of the present invention, based on the sixth or seventh aspect, the power number D of the power approximate expression is determined by a regression computation processing by using a plurality of measured disconnected voltages and corresponding times from the completion of the charge or the discharge.

According to the eighth aspect, the power number D of the power approximate expression is determined by a regression computation processing by using a plurality of measured disconnected voltages and corresponding times from the completion of the charge or the discharge. Accordingly, even if the power number D of the power approximate expression $\alpha \cdot t^D$ does not become −0.5, the assumed open circuit voltage can be estimated to be the open circuit voltage when the determination of the power approximate expression is repeated by a predetermined number of times. Therefore, an asymptote of the power approximate expression not changing due to the temperature can be accurately estimated to be the open circuit voltage by measuring the disconnected voltages of the battery in a relatively short time after completion of the charge or the discharge of the battery. Therefore, a vehicle battery's open circuit voltage estimating system, which can relatively correctly estimate the open circuit voltage of the battery in a relatively short time after completion of the charge or the discharge of the battery without a temperature correction, can be provided.

The above and other objects and features of the present invention will become more apparent from the following description taken in conjunction with the accompanying drawings.

DESCRIPTION OF THE PREFERRED EMBODIMENT(S)

Embodiment(s) of the present invention will now be described in further detail with reference to the accompanying drawings. Before describing the vehicle battery's open circuit voltage estimating method and the system therefor, a basic concept of the present invention is described.

Figure 3:
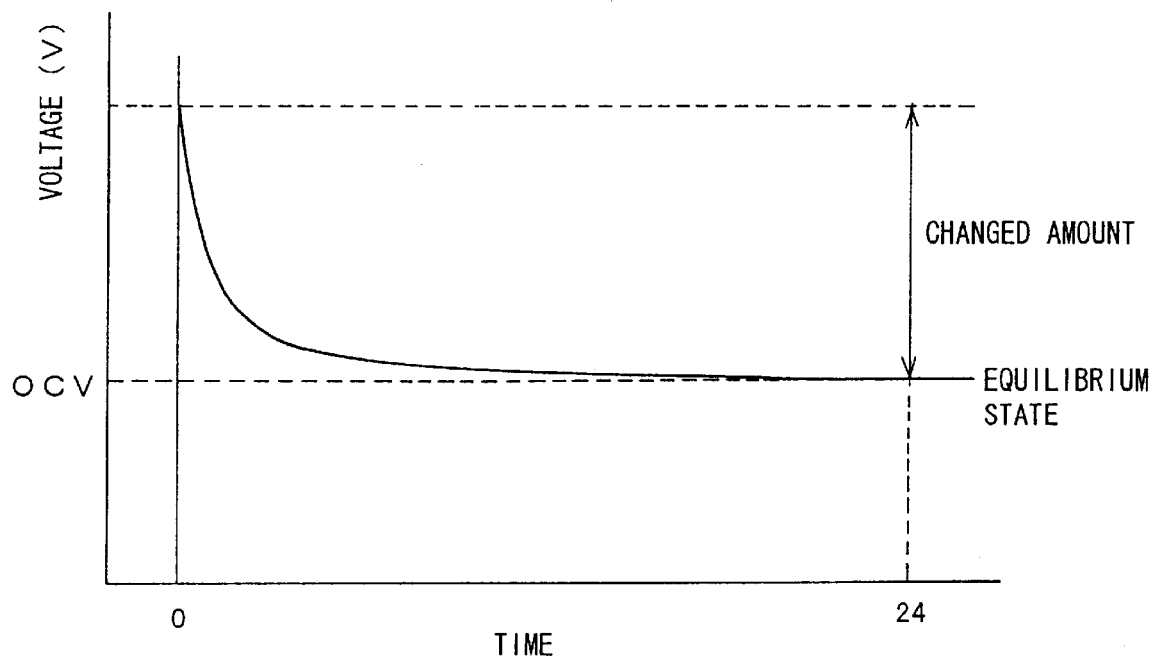
FIG. 3 is a graph showing a change of the disconnected voltage of the battery after the completion of the charge.

Generally, when the charge of the battery carried on a vehicle is completed, the terminal voltage of the battery in a disconnected state gradually decreases from a point due to the concentration polarization to be dissolved gradually and, as shown in FIG. 3, changes asymptotically to the open circuit voltage OCV being the terminal voltage at the equilibrium state of the battery after, for example, 24 hours. Such an asymptotic curve is generally given by a power expression.

Figure 5:
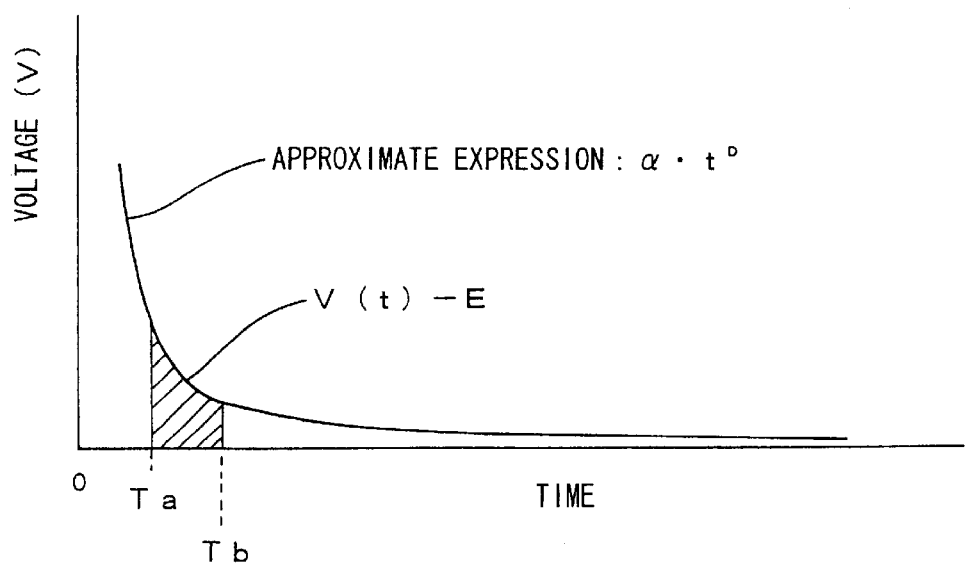
FIG. 5 is another graph also used for describing the inventive open circuit voltage estimating method.
Figure 4:
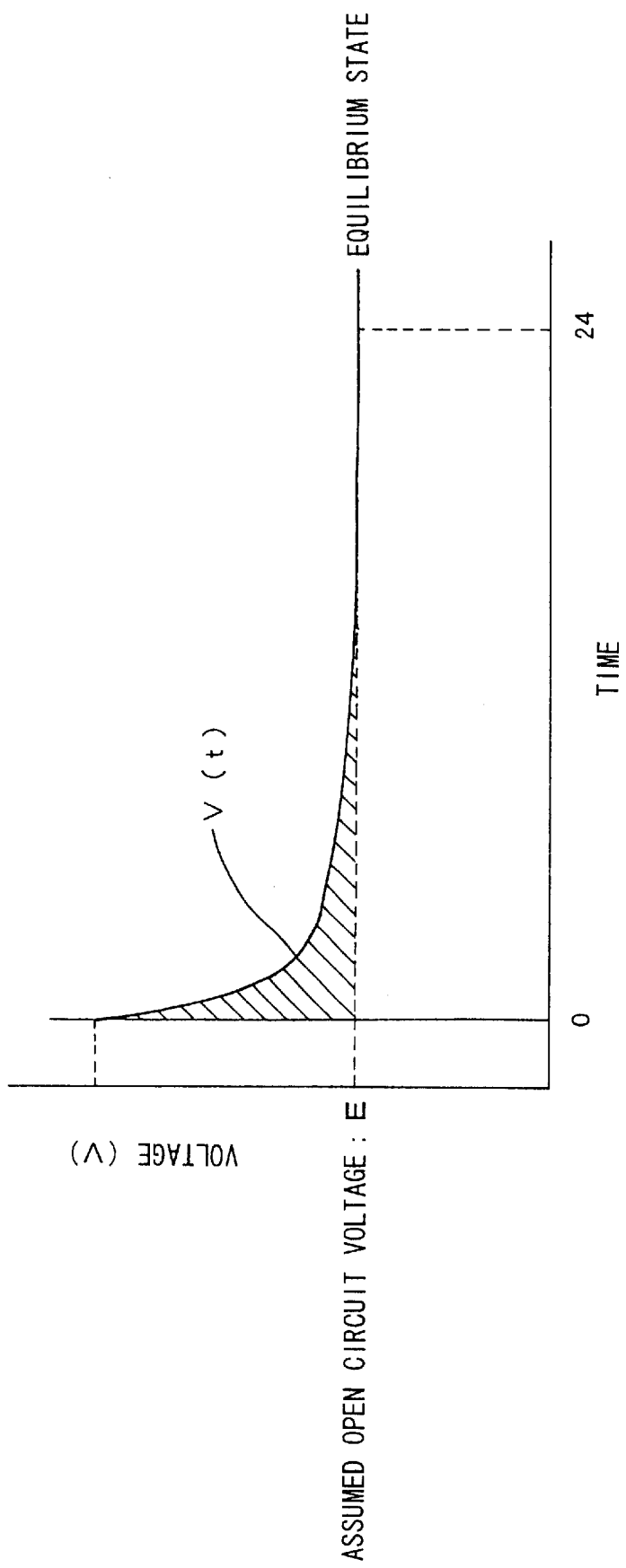
FIG. 4 is a graph used for describing the inventive open circuit voltage estimating method.

When the open circuit voltage OCV is unknown, as shown in FIG. 4, an assumed open circuit voltage E is determined, and the assumed open circuit voltage E is subtracted from the terminal voltage V(t), whereby the open circuit voltage OCV is given by a power approximate expression $\alpha \cdot t^D$ changing asymptotically to the transverse axis as shown in FIG. 5. If a diffusion phenomenon is expressed by the power approximate expression $\alpha \cdot t^D$, the power number D should be about −0.5.

Therefore, after the completion of the charge of the battery, the disconnected voltage of the battery for, for example, 15 minutes from a predetermined time Ta to another predetermined time Tb as shown in FIG. 5, and the power approximate expression $\alpha \cdot t^D$ is obtained by subtracting the assumed open circuit voltage E from the measured disconnected voltage.

Generally, the power number D of the power approximate expression $\alpha \cdot t^D$ should be about −0.5. Because the change of the open circuit voltage after the charge completion is due to the diffusion of the electrolyte, the assumed open circuit voltage E obtained when the power number D of the power approximate expression $\alpha \cdot t^D$ becomes −0.5 can be considered to be the open circuit voltage.

Reversely, when the discharge of the battery is completed, the terminal voltage of the battery in a disconnected state gradually increases from a point due to the concentration polarization to be dissolved gradually and, changes asymptotically to the open circuit voltage OCV being the terminal voltage at the equilibrium state of the battery after, for example, 24 hours. Here, in the discharge, the assumed open circuit voltage E is always bigger than the power approximate expression $\alpha \cdot t^D$, a value obtained by subtracting the assumed open circuit voltage E from the measured disconnected voltage becomes negative. Therefore, the power approximate expression $\alpha \cdot t^D$ is calculated by using an absolute value of the value obtained by subtracting the assumed open circuit voltage E from the disconnected voltage.

Generally, after the charge or the discharge is completed, the disconnected voltage of the battery is measured multiple times in a definite period of time after a predetermined period of time. A power approximate expression having a negative power number is determined by subtracting the assumed open circuit voltage from the measured disconnected voltage. The power approximate expression is repeatedly obtained by updating the assumed open circuit voltage until the power number of this determined power approximate expression becomes −0.5. The assumed open circuit voltage is estimated to be the open circuit voltage when the power number becomes −0.5.

Here, if the power number does not converges to −0.5 with all the repeated calculations by a predetermined number of times, the repeated calculations may be closed for avoiding inefficient processing, while estimating the assumed open circuit voltage of this time to be the open circuit voltage.

A sampling of the disconnected voltage is stared after the predetermined time Ta to be, for example, five minutes after stopping the charge or the discharge in order to exclude voltage changing components, being error factors and unrelated to the diffusion of the electrolyte, such as an internal resistance, an activation polarization, an over-voltage with gas-generation.

And, the sampling is limited to the time Tb because there would be a risk of lowering an estimation accuracy of the open circuit voltage according to the resolution of the measurement and because the influence of the voltage drop by a dark current of the vehicle becomes larger as time goes on.

Figure 6:
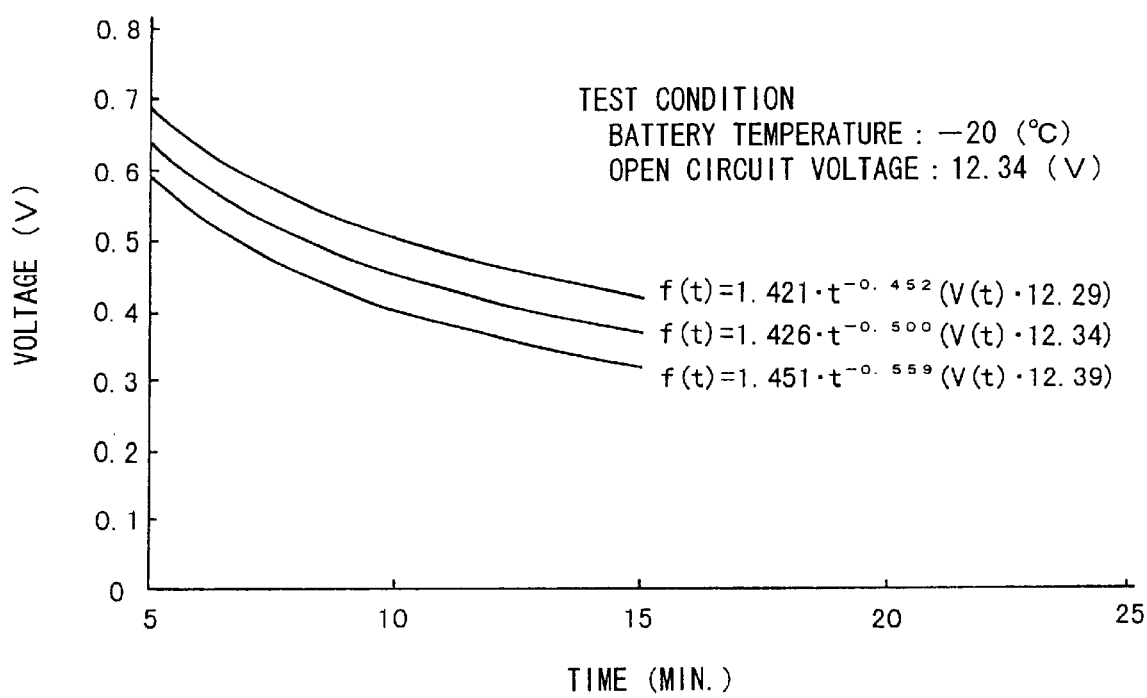
FIG. 6 is a graph for showing suitability of the inventive open circuit voltage estimating method.

A concrete example showing that the power number D becomes about −0.5 when the diffusion phenomenon is represented by the power approximate expression $\alpha \cdot t^D$ by referring to FIG. 6. In the battery with the open circuit voltage of 12.34V, when the assumed open circuit voltage is 12.34V, the power number is −0.500 in the power approximate expression determined by using a value obtained by subtracting the assumed open circuit voltage from the disconnected voltage measured after the charge is stopped. On the other hand, when the assumed open circuit voltage is 12.29V being smaller than 12.34V, the power number becomes −0.452 being smaller than −0.500. And, when the assumed open circuit voltage is 12.39V being larger than 12.34V, the power number becomes −0.559 being larger than −0.500. This shows that when the power number of the power approximate expression is −0.5, the assumed open circuit voltage becomes equal to the open circuit voltage.

Figure 1:
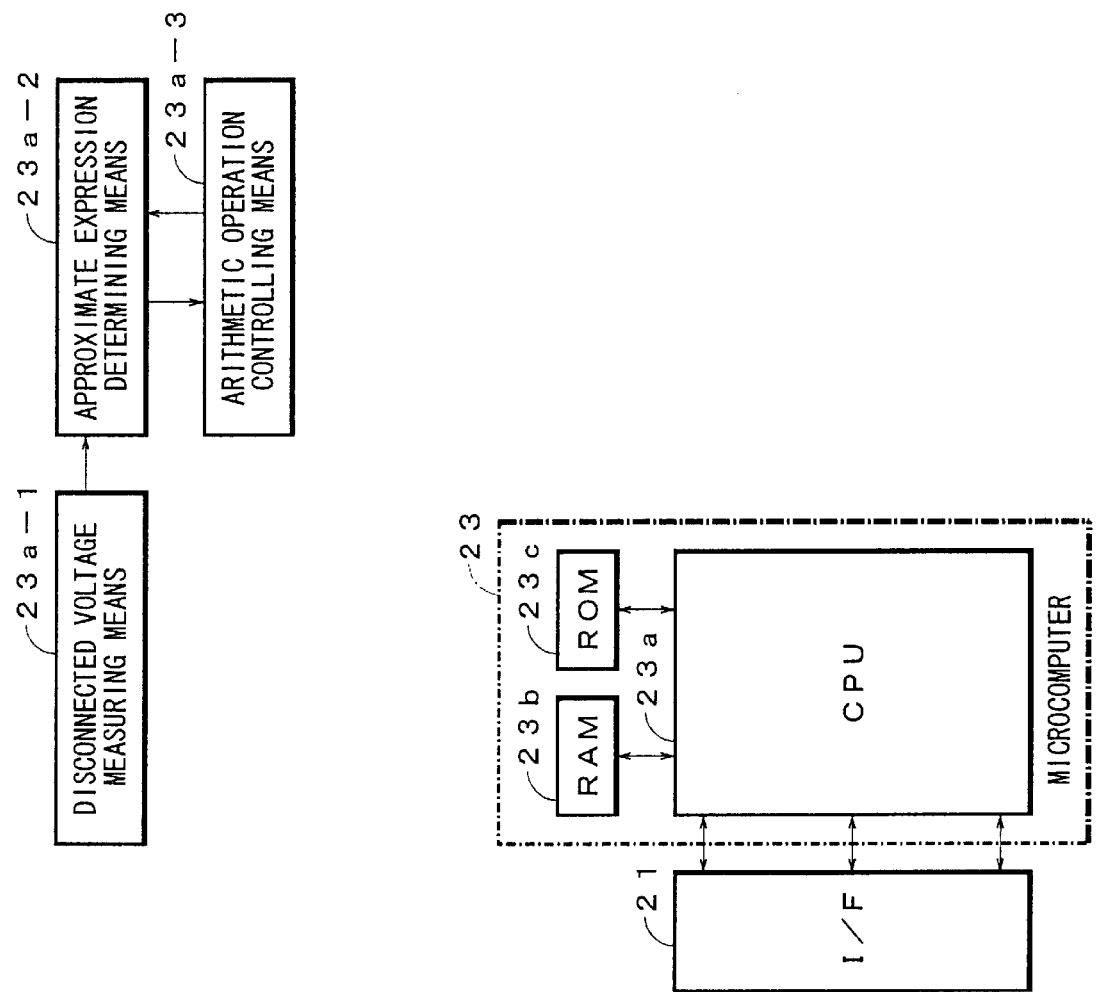
FIG. 1 is a block diagram showing a basic structure of a vehicle battery's open circuit voltage estimating system in accordance with the present invention.
Figure 2:
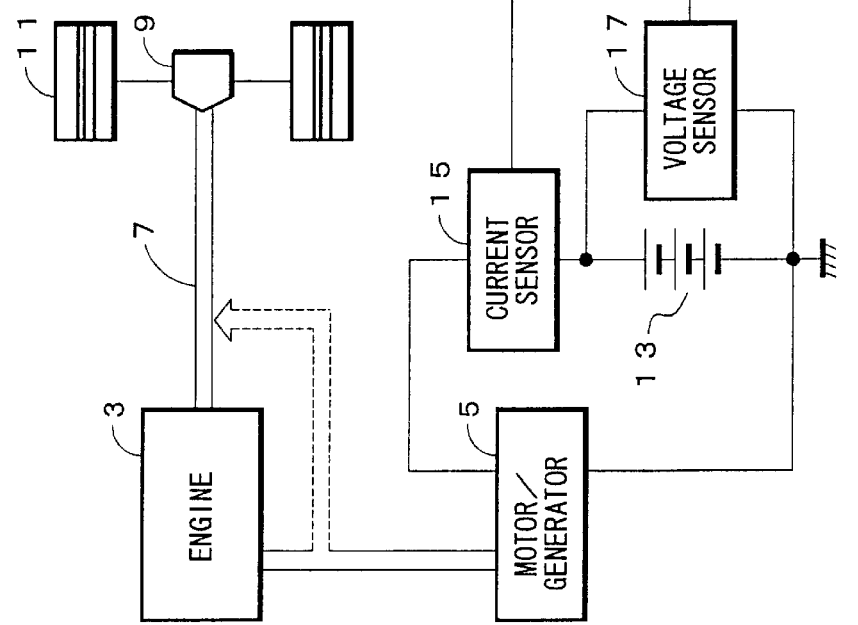
FIG. 2 is a schematic illustration showing an embodiment of the inventive vehicle battery's open circuit voltage estimating, system to which the inventive vehicle battery's open circuit voltage estimating method is applied.

FIG. 2 is a schematic illustration showing an embodiment of the inventive vehicle battery's open circuit voltage estimating system to which the inventive vehicle battery's open circuit voltage estimating method is applied. The vehicle battery's open circuit voltage estimating system, of the present embodiment, shown by reference number 1 is installed in a hybrid vehicle having a motor/generator 5 in addition to an engine 3.

The hybrid vehicle normally runs by transmitting only the output of the engine 3 to the wheels 11 through the drive shaft 7 and the differential casing 9. In a heavy load driving, the motor/generator 5 is operated as a motor by using the electric power from the battery 13. That is, the output of the motor/generator 5 is added to the output of the engine 3.

And, the hybrid vehicle makes the motor/generator 5 function as a generator during the deceleration or the braking, thereby converting the kinetic energy into the electric energy for charging the battery 13.

The motor/generator 5 is used as a self-starter motor to forcibly rotate a flywheel of the engine 3 at the starting of the engine 3 by the non-shown starting switch. At that time a large current flows to the motor/generator 5 in a little while. When the engine 3 is started by the motor/generator 5 with ON of the starting switch and the ignition key (not shown) is released, the starting switch turns OFF and the ignition switch and accessories' switch turn ON. Along with the above, the discharge current from the battery 13 becomes the steady current.

The inventive open circuit voltage estimating system 1 of the vehicle battery has a current sensor 15 to detect the discharge current I of the battery 13 for electric appliances, such as the motor/generator 5 functioning as a motor, and to detect the charge current for the battery 13 from the motor/generator 5 functioning as a generator. And, the inventive open circuit voltage estimating system 1 has a voltage sensor 17, having a resistance of about 1M ohm connected in parallel with the battery 13, to detect the terminal voltage V of the battery 13.

And, the open circuit voltage estimating system 1 of the vehicle battery of the present embodiment has a microcomputer 23 to receive the outputs of the current. sensor 15 and the voltage sensor 17 after these outputs have been A/D-converted at an interface circuit (I/F) 21.

And, the above microcomputer 23 has CPU 23a, RAM 23b and ROM 23c. The above I/F 21, RAM 23b and ROM 23c are connected to CPU 23a, and the above starting switch, the ignition switch, the accessories' switch, and switches of electric appliances other than the above motor/generator 5 are connected to CPU 23a.

The above RAM 23b has a work area for various processing work and a data area for storing various data, and the control program for CPU 23a is stored in the above ROM 23c.

The outputs of the current sensor 15 and the voltage sensor 17, i.e. a current value and a voltage value, are taken in CPU 23a of the microcomputer 23 through I/F 21.

Figure 7:
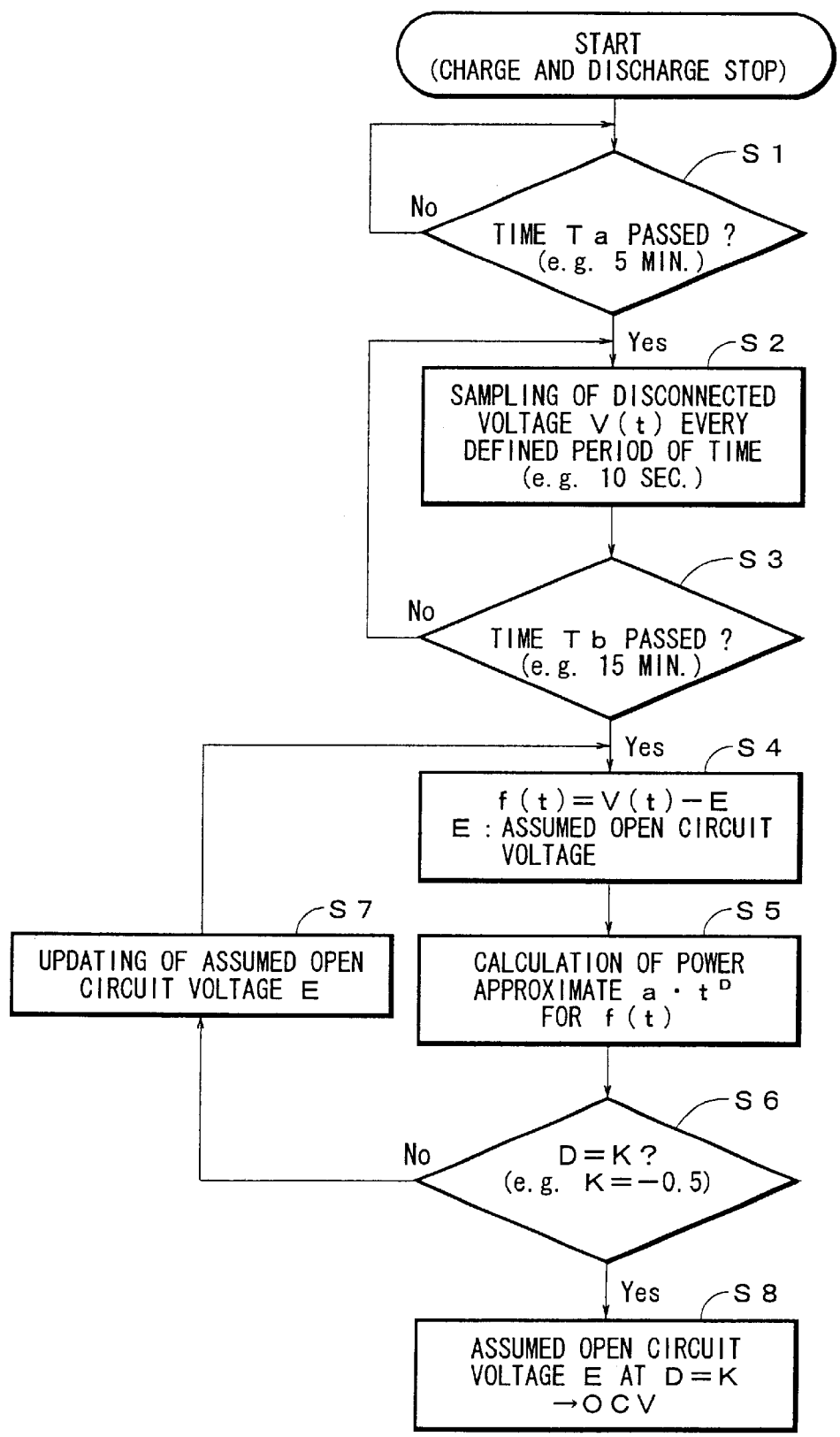
FIG. 7 is a flowchart showing a processing carried out by a microcomputer shown in FIG. 2 according to a predetermined program for estimating an open circuit voltage of the battery.
Figure 9:
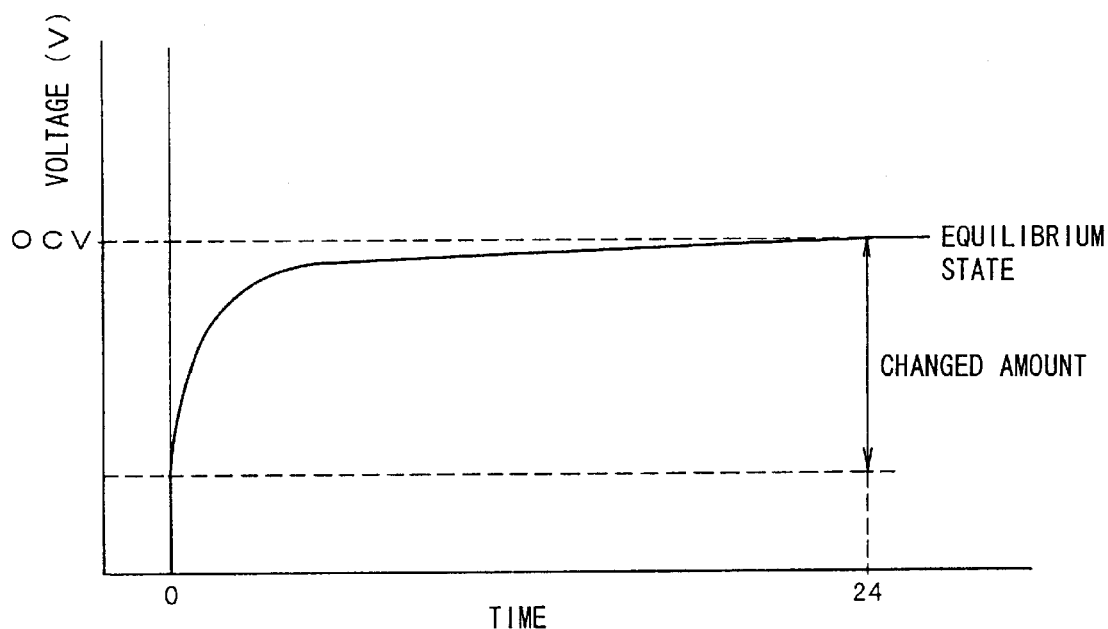
FIG. 9 is a graph showing a change of the disconnected voltage of the battery after the completion of the discharge.
Figure 10:
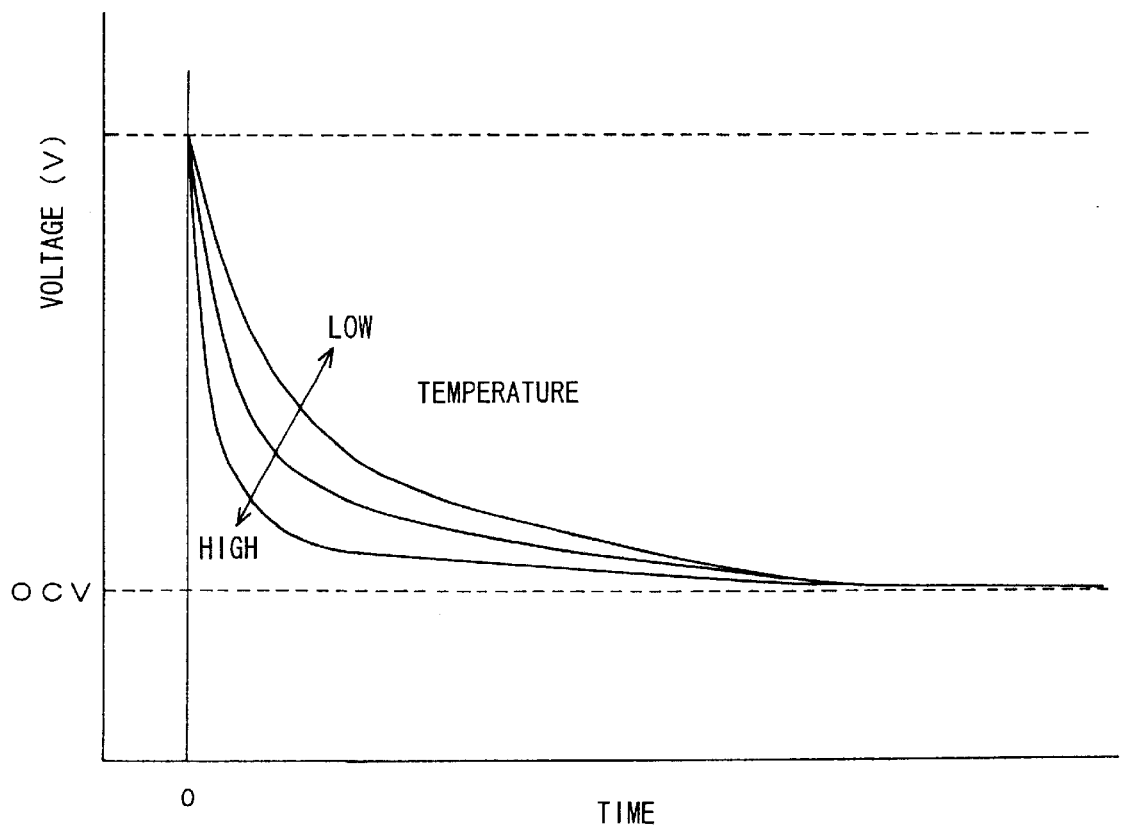
FIG. 10 is a graph showing a change, according to the temperature, of the disconnected voltage of the battery after the completion of the charge.

Next, a battery's open circuit voltage estimation processing carried out by CPU 23a according to the control program stored in ROM 23c is described by making reference to FIG. 7.

In a state that the microcomputer 23 has been started with the power supply from the battery 13, the microcomputer 23, based on the current value obtained by sampling the output of the current sensor 15 for example, judges whether the charge or the discharge is completed on the basis of the current value being 0. When the completion of the charge or the discharge is detected as a result of this judgement, the open circuit voltage estimation processing shown in a flow-chart of FIG. 7 is started. In this open circuit voltage estimation processing, first, whether a predetermined time Ta of, for example, 5 minutes from the completion of the charge or the discharge is passed or not is judged (Step S1).

If not, the passing of time is awaited, and when the time has passed (Y of Step Si), the terminal voltage of the battery is sampled as the disconnected voltage by the output of the voltage sensor 16 every definite period of time of 10 seconds for example and then stored in the data area of RAM 23*b* (a memorizing means) (Step S2). The above sampling is repeated until the predetermined time Tb of, for example, 15 minutes passes from the completion of the charge or the discharge (N of Step S3).

When the time Tb has passed (Y of Step S3), a difference value of the measured disconnected voltage V(t) and the assumed open circuit voltage E is calculated (Step S4). The difference value is obtained by subtracting the assumed open circuit voltage E from the measured disconnected voltage V(t) after the charge and, however, is an absolute value of a value obtained by subtracting the assumed open circuit voltage E from the measured disconnected voltage V(t) after the discharge. A power approximate processing is carried out on the obtained value f(t) to determine the power approximate expression having a negative power number (Step S5). Next, it is judged whether the power number D is equal to −0.5 or not (Step S6). If the power number D is not equal to −0.5 (N of Step S6), the assumed open circuit voltage E is updated (Step S7). Then, the process return the above Step S4 so as to carry out the processing of subtracting the updated assumed open circuit voltage E from the measured disconnected voltage V(t). When the power number D has become −0.5 (Y of Step S6), the assumed open circuit voltage E is estimated to be the open circuit voltage, and the serial processing operation is closed.

Here, though there is no indication in the flowchart, if the power number of the determined power approximate expression hardly becomes −0.5, the serial processing operation may be closed upon completion of predetermined number of times, while estimating the last assumed open circuit voltage E to be the open circuit voltage.

Though the sampling time is, for example, 10 seconds between the time Ta and time Tb, the sampling time can be shortened, while leaving the microcomputer in a sleep state while the sampling is not carried out.

A way of determining the power approximate expression at the above Step S5 is described hereinafter.

When the power approximate expression is $y=\alpha \cdot x^D$:

$$ln(y)=ln(\alpha)+D \cdot ln(x)$$

When $ln(y)=Y$, $ln(\alpha)=A$, and $ln(x)=X$:

$$Y=A+D \cdot X$$

The above A and D are obtained by a regression computation processing as follows.

If a difference between a calculated value of the approximate expression and the real data is $\epsilon$:

$$Yi=A+D \cdot Xi+\epsilon i (i=1, 2, \ldots, n)$$

Since A and D are obtained such that the total of $\epsilon i^2$ can be the smallest.

That is, according to the method of least squares:

$$\delta \Sigma \epsilon i/\delta A=0$$
$$\delta \Sigma \epsilon i/\delta D=0$$

When these simultaneous equations are solved:

$$\Sigma Yi-D\Sigma Xi-\Sigma A=0$$
$$\Sigma XiYi-D\Sigma Xi^2-A\Sigma Xi=0$$

With the above:

$$D=(\Sigma XiYi-nXaYa)/(\Sigma Xi^2-nXa^2)$$
$$A=Ya-DXa$$

Here, the above symbols are:

Xi X-axis data
Yi Y-axis data
n data number
Xa average value of Xi
Ya average value of Yi As above, since $A=ln(\alpha)$, $$\alpha=e^A$$

Therefore, the power approximate expression is:

$$y=\alpha \cdot x^D$$

Figure 8:
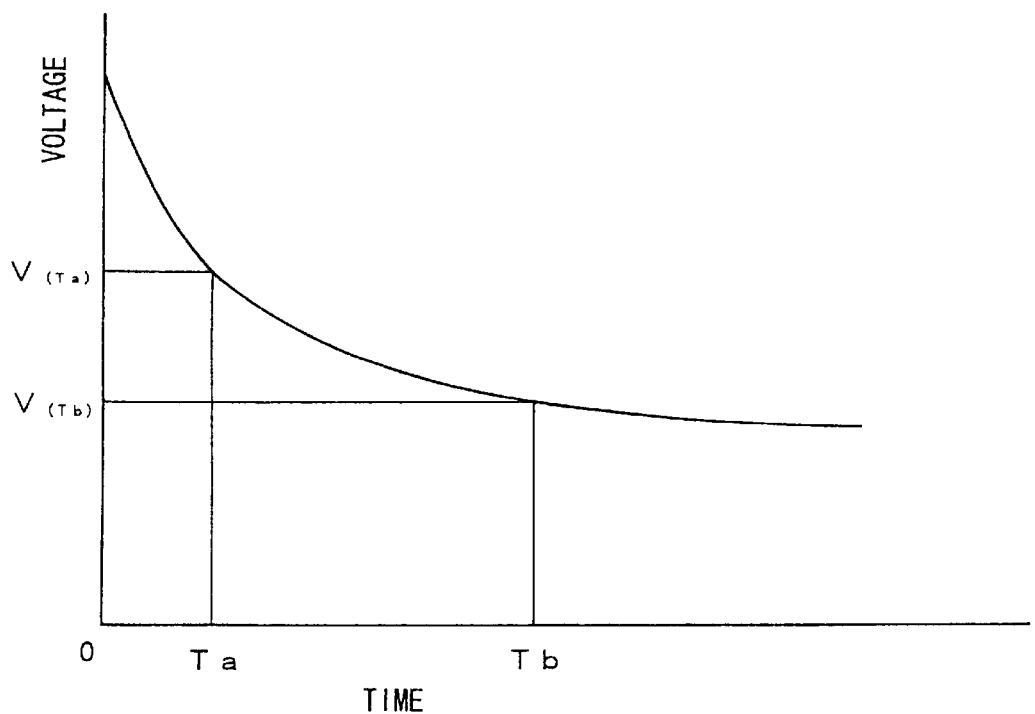
FIG. 8 is a graph used for describing a method of updating an assumed open circuit voltage.

Next, an updating method of the assumed open circuit voltage at Step S7 is described by making reference to FIG. 8 and Table 1.

TABLE 1

| Number of Search | Lower Limit | | Middle | | Upper Limit | |
|---|---|---|---|---|---|---|
| | Assumed Open Circuit Voltage | D | Assumed Open Circuit Voltage | D | Assumed Open Circuit Voltage | D |
| 1 | 0.000 | −0.019 | 6.350 | −0.037 | 12.700 | −2.639 |
| 2 | 6.350 | −0.037 | 9.525 | −0.073 | 12.700 | −2.639 |
| 3 | 9.525 | −0.073 | 11.113 | −0.140 | 12.700 | −2.639 |
| 4 | 11.113 | −0.140 | 11.906 | −0.163 | 12.700 | −2.639 |
| 5 | 11.906 | −0.163 | 12.303 | −0.464 | 12.700 | −2.639 |
| 6 | 12.303 | −0.464 | 12.502 | −0.763 | 12.700 | −2.639 |
| 7 | 12.303 | −0.464 | 12.402 | −0.575 | 12.502 | −0.763 |
| 8 | 12.303 | −0.464 | 12.353 | −0.514 | 12.402 | −0.575 |
| 9 | 12.303 | −0.464 | 12.328 | −0.488 | 12.353 | −0.514 |
| 10 | 12.328 | −0.488 | 12.340 | −0.500 | 12.353 | −0.514 |

The assumed open circuit voltage after the charge or discharge completion is updated by the dichotomizing search. As shown in FIG. 8, first, the power approximation is carried out about, for example, the upper limit assumed open circuit voltage V(Tb), the lower limit assumed open circuit voltage 0, and the middle assumed open circuit voltage V(Tb)/2.

D(V(Tb)), D(0), and D(V(Tb)/2) obtained from the respective voltages are compared mutually, and whether D at the middle assumed open circuit voltage is equal to −0.5 or not is checked. If D at the middle assumed open circuit voltage is not equal to −0.5, whether this D is larger than −0.5, or smaller than −0.5, is checked. If D at the middle assumed open circuit voltage is not equal to −0.5,the range including data making D become −0.5 is calculated. In Table 1, D at the assumed open circuit voltage (V(Tb)+V(Tb)/2)/2 is calculated, and the comparison operation is repeated until D=−0.5 is obtained. In Table 1, the power numbers D of the respectively lower limit, middle limit and upper limit are calculated at all the search, the power D may be calculated for the middle limit after the first search.

Here, if the power number does not become −0.5 despite the repeated calculation by updating the assumed open circuit voltage, the system judges that the power number has become −0.5 by applying a judging value, i.e. a difference of the upper and lower limits, of 0.001 for example.

The first upper limit assumed open circuit voltage shall be higher than the open circuit voltage. The lower limit assumed open circuit voltage may be the open circuit voltage at the discharge completion (the charged amount of 0%), but an initial value thereof is set to be 0V since the open circuit voltage at the overdischarge could falls below the open circuit voltage at the discharge completion (the charged amount of 0%).

In the open circuit voltage estimating system 1 of the present embodiment, Step S2 in the flowchart of FIG. 7 corresponds to the disconnected voltage measuring means in claim, Step S5 corresponds to the approximate expression determining means in claim, and Step S6 and Step S7 correspond to the arithmetic operation controlling means in claim.

Next, an open circuit voltage estimating operation (action) of the present embodiment is described.

First, when electric appliances (loads) other than the motor/generator 5 of the hybrid vehicle is working or the motor/generator 5 is functioning as the motor, the battery 13 is discharging. The charge is made to the battery 13 when the motor/generator 5 is functioning as the generator. The charge or the discharge of the battery can be detected by taking in the output of the current sensor 15, and the completion of the charge or the discharge can also be detected by the output of the current sensor 15 being 0.

When the completion of the charge or the discharge is detected by the output of the current sensor 15, the terminal voltages of the battery are periodically measured as the disconnected voltages by taking in the outputs of the voltage sensor 17 during a period of time from the time Ta to the time Tb. The voltage values and the corresponding elapsed times from the completion of the charge or the discharge are stored in the data area of RAM 23b. The assumed open circuit voltage E is subtracted from each of the stored terminal voltages V(t), and the power approximate expression is determined from the obtained values by applying the method of least squares. Then, whether or not the power number D of the determined power approximate expression $\alpha \cdot t^D$ is −0.5 is judged. If the power number D is not −0.5, the assumed open circuit voltage E is updated and the similar processing is carried out again so as to determine the power approximate expression $\alpha \cdot t^D$. The above operation is repeatedly carried out until the power number D becomes −0.5 or about −0.5 so as to estimate the assumed open circuit voltage to be the open circuit voltage. Here, for using "about −0.5", repeating times for determining the power approximate expression or a range of the assumed open circuit voltage is predetermined.

As above, the estimated open circuit voltage becomes an asymptote of the power approximate expression $\alpha \cdot t^D$ and does not shift by the time Ta and Tb, even if the power approximate expression $\alpha \cdot t^D$ has changed by temperature. Therefore, the estimated open circuit voltage does not need correction for temperature and further is applicable to another battery having a slightly different characteristic. Besides, if the charge or discharge current does not flow between the period Ta–Tb from the completion of the charge or the discharge, the open circuit voltage can be estimated each time, thereby increasing the chance of estimating the open circuit voltage.

The asymptote of the power approximate expression is assumed not to change by temperature in the above description because change of the open circuit voltage by temperature is very small and is negligible.

In the hybrid vehicle, the present invention is applicable to measure the state of the battery in order to effectively use the battery for improving the fuel consumption.

Here, in this specification, the terminal voltage receiving the influence of the polarization is defined as the disconnected voltage, and the terminal voltage in the equilibrium state is defined as the open circuit voltage.

Though the estimation of the open circuit voltage of the battery on the hybrid vehicle is described, the present invention can be applied to the estimation of the open circuit voltage of the batteries aboard various kinds of vehicles, such as a general 14V (volt) power source vehicle, a multi-power source (such as 14V and 42V) vehicle, an electric vehicle, and a general gasoline automobile.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A vehicle battery's open circuit voltage estimating method for estimating an open circuit voltage of a vehicle-borne battery supplying electric power to vehicle-borne loads, comprising the steps of:

measuring a disconnected voltage of the battery multiple times in a definite period of time after a predetermined period of time after completion of charge or discharge of the battery;

determining a power approximate expression having a negative power number by using a difference value of the measured disconnected voltage and an assumed open circuit voltage;

repeating the determination of the power approximate expression by updating the assumed open circuit voltage until the power number of the determined power approximate expression becomes −0.5 or about −0.5; and estimating the assumed open circuit voltage to be the open circuit voltage when the power number becomes −0.5 or about −0.5.

2. The vehicle battery's open circuit voltage estimating method as set forth in claim 1, wherein the power approximate expression is given by $\alpha \cdot t^D$ with time t, an unknown coefficient $\alpha$, and an unknown negative power number D, when the disconnected voltage is measured after completion of the charge.

3. The vehicle battery's open circuit voltage estimating method as set forth in claim 1, wherein the difference value for determining the power approximate expression is an absolute value obtained by subtracting the assumed open circuit voltage from the measured disconnected voltage when the disconnected voltage is measured after completion of the discharge, and the power approximate expression is given by $\alpha \cdot t^D$ with time t, an unknown coefficient $\alpha$, and an unknown negative power number D.

4. The vehicle battery's open circuit voltage estimating method as set forth in claim 2 or claim 3, wherein the power number D of the power approximate expression is determined by a regression computation processing by using a plurality of measured disconnected voltages and corresponding times from the completion of the charge or the discharge.

5. A vehicle battery's open circuit voltage estimating system for estimating an open circuit voltage of a vehicle-borne battery supplying electric power to vehicle-borne loads, comprising:

a disconnected voltage measuring means for measuring a disconnected voltage of the battery multiple times in a definite period of time after a predetermined period of time after completion of charge or discharge of the battery;

an approximate expression determining means for determining a power approximate expression having a negative power number by using a difference value of the measured disconnected voltage and an assumed open circuit voltage; and an arithmetic operation controlling means for making the approximate expression determining means update the assumed open circuit voltage and determine the power approximate expression repeatedly until the power number of the determined power approximate expression becomes −0.5 or about −0.5, wherein the assumed open circuit voltage is estimated to be the open circuit voltage when the power number becomes −0.5 or about −0.5.

6. The vehicle battery's open circuit voltage estimating system as set forth in claim 5, wherein the power approximate expression is given by $\alpha \cdot t^D$ with time t, an unknown coefficient $\alpha$, and an unknown negative power number D, when the disconnected voltage is measured after completion of the charge.

7. The vehicle battery's open circuit voltage estimating system as set forth in claim 5, wherein the difference value for determining the power approximate expression is an absolute value obtained by subtracting the assumed open circuit voltage from the measured disconnected voltage when the disconnected voltage is measured after completion of the discharge, and the power approximate expression is given by $\alpha \cdot t^D$ with time t, an unknown coefficient $\alpha$, and an unknown negative power number D.

8. The vehicle battery's open circuit voltage estimating system as set forth in claim 6 or claim 7, wherein the power number D of the power approximate expression is determined by a regression computation processing by using a plurality of measured disconnected voltages and corresponding times from the completion of the charge or the discharge.

* * * * *